(12) United States Patent
Elam et al.

(10) Patent No.: US 8,969,823 B2
(45) Date of Patent: Mar. 3, 2015

(54) MICROCHANNEL PLATE DETECTOR AND METHODS FOR THEIR FABRICATION

(75) Inventors: Jeffrey W. Elam, Elmhurst, IL (US);
Anil U. Mane, Downers Grove, IL (US);
Qing Peng, Downers Grove, IL (US)

(73) Assignee: UChicago Argonne, LLC, Chicago, IL (US)

( * ) Notice: Subject to any disclaimer, the term of this patent is extended or adjusted under 35 U.S.C. 154(b) by 142 days.

(21) Appl. No.: 13/011,645

(22) Filed: Jan. 21, 2011

(65) Prior Publication Data
US 2012/0187305 A1   Jul. 26, 2012

(51) Int. Cl.
*G01T 3/00* (2006.01)
*H01J 43/24* (2006.01)
*C23C 16/455* (2006.01)

(52) U.S. Cl.
CPC ......... *H01J 43/246* (2013.01); *C23C 16/45529* (2013.01); *C23C 16/45555* (2013.01)
USPC .................................................. 250/390.01

(58) Field of Classification Search
USPC .................................................. 250/390.01
See application file for complete search history.

(56) References Cited

U.S. PATENT DOCUMENTS

| | | | |
|---|---|---|---|
| 3,673,457 A | 6/1972 | Sackinger et al. | |
| 3,739,216 A | 6/1973 | Pakswer | |
| 4,051,403 A | 9/1977 | Feingold et al. | |
| 4,625,106 A | 11/1986 | Bender et al. | |
| 4,757,229 A | 7/1988 | Schmidt et al. | |
| 5,068,634 A * | 11/1991 | Shrier | 338/21 |
| 5,086,248 A | 2/1992 | Horton et al. | |
| 5,216,249 A | 6/1993 | Jones et al. | |
| 5,334,840 A | 8/1994 | Newacheck et al. | |
| 5,402,034 A * | 3/1995 | Blouch et al. | 313/370 |
| 5,726,076 A | 3/1998 | Tasker et al. | |
| 6,200,893 B1 * | 3/2001 | Sneh | 438/685 |
| 6,420,279 B1 | 7/2002 | Ono et al. | |
| 6,479,826 B1 | 11/2002 | Klann et al. | |
| 6,495,837 B2 | 12/2002 | Odom et al. | |
| 6,503,330 B1 | 1/2003 | Sneh et al. | |
| 6,545,281 B1 | 4/2003 | McGregor et al. | |

(Continued)

FOREIGN PATENT DOCUMENTS

JP      2007-277105 A    10/2007
WO   WO 2012/099658 A2   7/2012

OTHER PUBLICATIONS

Elam et al., "Properties of ZnO/Al2O3 Alloy Films Grown Using Atomic Layer Deposition Techniques", *Journal of the Electrochemical Society*, (2003), pp. G339-G347, vol. 150, No. 6, The Electrochemical Society, Inc.

(Continued)

*Primary Examiner* — David Porta
*Assistant Examiner* — Edwin Gunberg
(74) *Attorney, Agent, or Firm* — Foley & Lardner LLP

(57) ABSTRACT

A multi-component tunable resistive coating and methods of depositing the coating on the surfaces of a microchannel plate (MCP) detector. The resistive coating composed of a plurality of alternating layers of a metal oxide resistive component layer and a conductive component layer composed of at least one of a metal, a metal nitride and a metal sulfide. The coating may further include an emissive layer configured to produce a secondary electron emission in response to a particle interacting with the MCP and a neutron-absorbing layer configured to respond to a neutron interacting with the MCP.

8 Claims, 13 Drawing Sheets

(56) References Cited

U.S. PATENT DOCUMENTS

| | | | |
|---|---|---|---|
| 6,585,823 | B1 | 7/2003 | Van Wijck |
| 6,876,711 | B2 * | 4/2005 | Wallace et al. ............... 376/154 |
| 7,164,138 | B2 | 1/2007 | McGregor et al. |
| 7,233,007 | B2 | 6/2007 | Downing et al. |
| 7,335,594 | B1 | 2/2008 | Wang et al. |
| 7,595,270 | B2 * | 9/2009 | Elers et al. .................... 438/785 |
| 7,759,138 | B2 * | 7/2010 | Beaulieu et al. ............... 438/20 |
| 8,101,480 | B1 * | 1/2012 | Kim et al. ..................... 438/231 |
| 2007/0131849 | A1 | 6/2007 | Beaulieu et al. |
| 2009/0212680 | A1 | 8/2009 | Tremsin et al. |
| 2009/0215211 | A1 | 8/2009 | Tremsin et al. |
| 2009/0315443 | A1 * | 12/2009 | Sullivan et al. ........ 313/103 CM |
| 2010/0044577 | A1 | 2/2010 | Sullivan et al. |
| 2012/0187305 | A1 | 7/2012 | Elam et al. |

OTHER PUBLICATIONS

PCT/US2011/064593, International Search Report, Jul. 11, 2012.

George, S., "Fabrication and Priorities of Nanolaminates Using Self-Limiting Surface Chemistry Techniques", Dept. of Chemistry and Biochemistry, Dept. of Chemical Engineering, Nov. 2002, 20 pages.

Wu, G. et al., "High-Performance Electrocatalysts for Oxygen Reduction Derived from Polyaniline, Iron, and Cobalt", Science, vol. 332, 2011, pp. 443-447.

Ma, S. et al., "Cobal Imidazolate Framework as Precursor for Oxygen Reduction Reaction Electroatalysts", Chem. Eur. J., vol. 17, 2011, pp. 2063-2067.

Faubert G. et al., "Activation and charactterization of Fe-based catalysts for the reduction of oxygen in polymer electrolyte fuel cells", Electrochimica Acta, vol. 43, Nos. 14-15, 1998, pp. 1969-1984.

Lefevre, M. et al., "Iron-Based Catalysts with Imporved Oxygen Reduction Activity in Polymer Electrolyte Fuel Cells", Science, vol. 324, 2009, pp. 71-74.

Jaouen, F. et al., "Cross-Laboratory Experimental Study of Non-Noble-Metal Electrocatalysts for the Oxygen Reduction Reaction", Applied Materials and Interfaces, vol. 1, No. 8, 2009, pp. 1623-1639.

Lefevre, M. & Dodelet, J., "Fe-based catyalysts for the reduction of oxygen in polymer electrolyte membrane fuel cell conditions: determination of the amount of peroxide released during electroreduction and its influence on the stablity of the catalysts", Electrochimica Acta, vol. 48, 2003, pp. 2749-2760.

\* cited by examiner

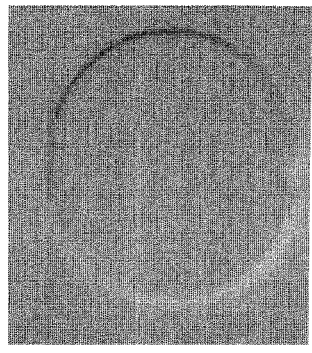
FIG. 8A
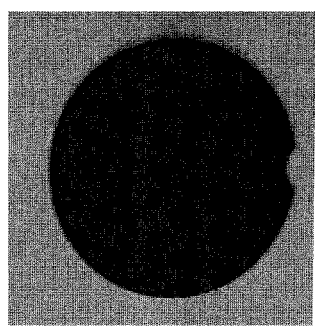
FIG. 8B
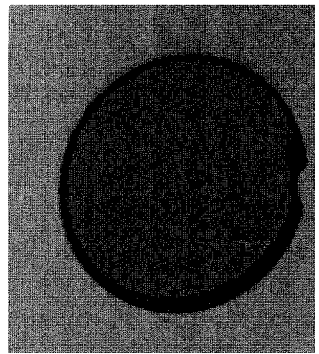
FIG. 8C
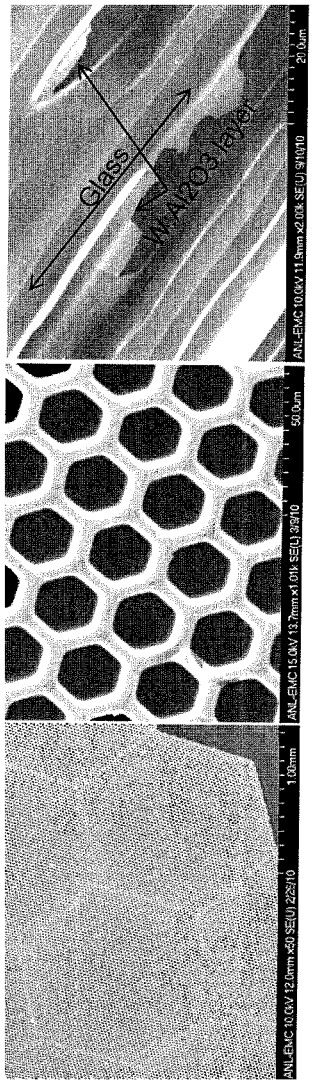
FIG. 9A
FIG. 9B
FIG. 9C

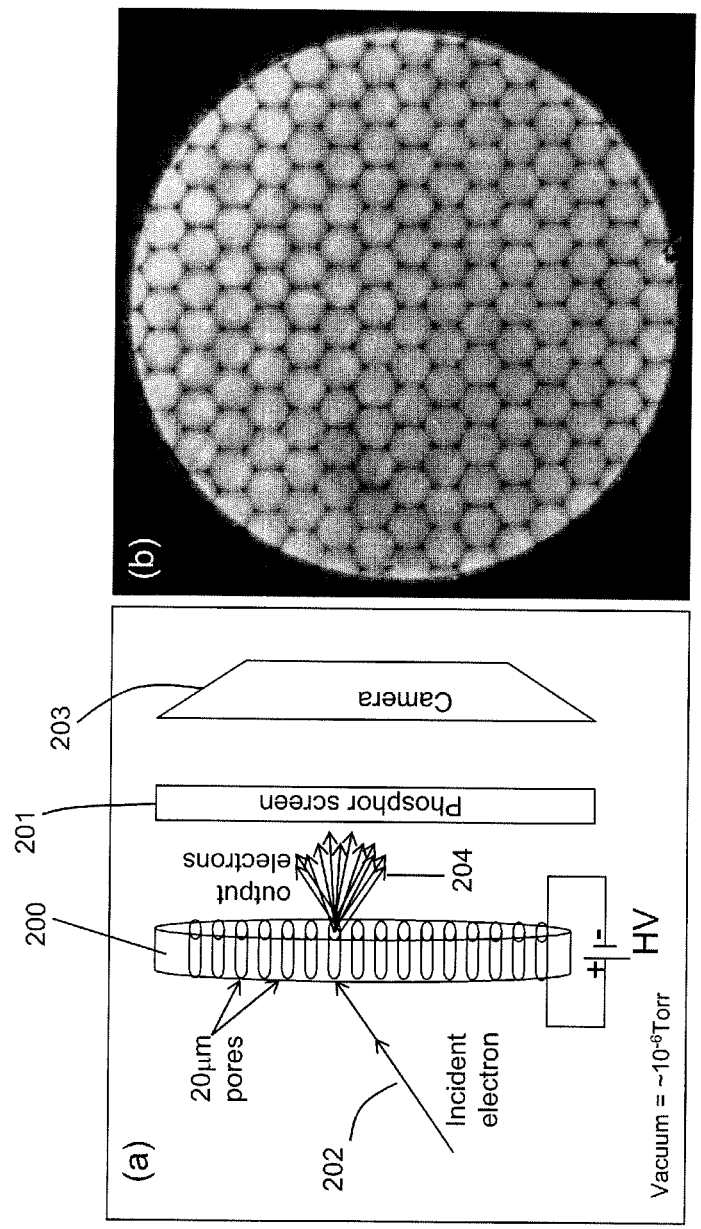
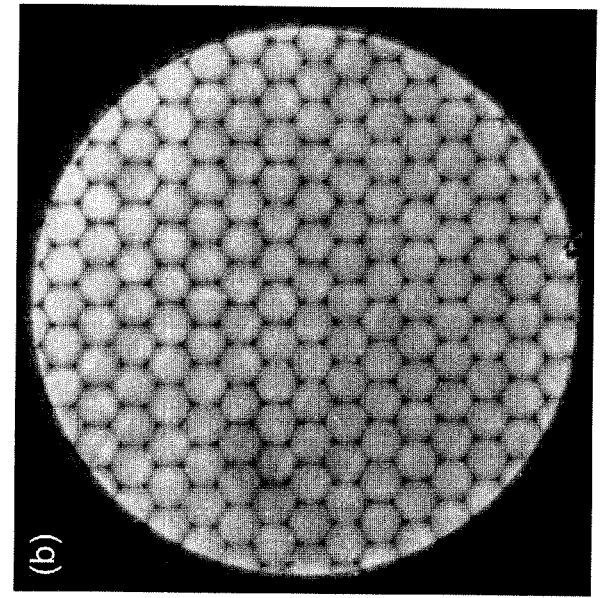
FIG. 15A
FIG. 15B

MICROCHANNEL PLATE DETECTOR AND METHODS FOR THEIR FABRICATION

GOVERNMENT INTEREST

The United States Government has rights in this invention pursuant to Contract No. DE-AC02-06CH11357 between the United States Government and the UChicago Argonne, LLC, representing Argonne National Laboratory.

FIELD OF THE INVENTION

The present invention pertains to thin film coatings. More particularly, the invention is directed to improved thin film coatings for fabrication of microchannel plate (MCP) detectors.

BACKGROUND

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

A MCP is a type of solid state electron amplifier. The MCP can, for example, be used as a component in a detector system to detect low levels of electrons, ions, photons, or neutrons, and provide an amplified response via a plurality of secondary electron emissions that occur within the channels of the MCP. An MCP is comprised of an array of narrow pores in a flat plate that permeate from the front surface of the plate to the back surface of the plate. A high voltage is applied across the plate such that the back surface is typically at 1000 V higher potential than the front surface. An Electron enters the front of an MCP into a channel, and impinges on the channel wall causing secondary electron emissions to be produced by an emissive layer on the channel surface. These secondary electrons are accelerated towards the back of the plate by the high voltage bias and impact on the channel wall to produce additional secondary electrons resulting in a cascading increase in electrons along the length of the MCP channel that exit the opposite end of the channel. Since the MCP pores operate independently, a spatial pattern of electrons incident on the front surface will be preserved so that the back surface emits the same pattern but greatly amplified. In this way, the MCP can be used in imaging applications. Various detectors may be located downstream of the MCP to detect and record the exiting electrons. MCP detectors have numerous applications, including use in night vision technology, medical imaging devices, homeland security, and particle detectors for use in laboratories and high energy physics installations.

FIG. 1 depicts a configuration of a conventional MCP detector. MCPs may be prepared with various dimensions and shapes but often are circular and have a diameter of about 3 to 10 cm and a thickness on the order of about 1 mm. The MCP disc is generally fabricated from highly resistive glass by heating and drawing composite glass fiber bundles comprising a core glass material and a cladding glass material. The fiber bundles are then cut into thin discs and polished.

Wet chemical etching or other techniques are used to remove the core glass component from the composite glass fiber bundles resulting in the formation of the MCP pores. The MCP pores form a parallel array of straight, circular open channels with diameters typically of about 10 to 40 microns that extend through the disc from the front to the rear surface. The channel density of a MCP is typically between $10^4$ and $10^6$ channels per square centimeter.

Conventionally, the MCP is hydrogen fired, reducing lead oxide proximate the channel surfaces to semiconducting lead. The reduction process imparts a high electrical resistance between the front and rear of the plate. Functional MCPs typically have a resistance on the order of $10^6$ to $10^8$ Ohms, but this value may vary significantly depending on various process attributes. Finally, to complete the MCP, the front and rear surfaces of the MCP are metalized with thin conductive coatings of a material such as nichrome that serve as electrodes and provide electrical contact with the device.

A MCP fabricated using conventional processes suffer from several limitations. For example, the process does not allow for independent control over the resistance and secondary electron yield (SEY) characteristics of the MCP. Significantly, the resulting MCP is generally characterized by a negative temperature coefficient that causes the MCP to heat, leading to increased current, which further heats the plate, resulting in thermal runaway. Additionally, conventional fabrication processes are currently quite costly, with a 33 mm commercial diameter MCP costing on the order of $1,000.

SUMMARY

The present invention provides improved thin film coatings that may be applied to a microporpous substrate, including the surfaces of the channels within the substrate. The coatings include various multi-component resistive coatings that have a highly tunable resistivity that is controlled by modulating the composition and ratio of the coating components as well as the coating thickness. The coatings further include various emissive coatings responsive to electron interactions within MCP channels to yield secondary electron emissions. The present invention further relates to an improved method of fabricating neutron detectors. A neutron-absorbing thin film may also be deposited on the channel surfaces that is responsive to neutron interactions within the MCP and leads to electron emissions which can then be amplified within the MCP channel. The various thin films may be independently deposited on a MCP, coating the channels of the MCP with high precision using various chemical deposition techniques, including chemical vapor deposition (CVD) and atomic layer deposition (ALD). Utilizing the methods of the present invention, it is predicated that MCP detector fabrication cost may be reduced by more than a factor of 10 over conventional processes.

One aspect of the present invention is to use ALD to prepare a resistive coating on the surface of the MCP channels. The resistive coating is a blend of a conducting component and an insulating component where the ratio of the conducing and insulating components substantially defines the resistivity of the resistive coating, which, in various embodiments, may be tuned over at least seven orders of magnitude. The resistive coating employs a conducting component that is composed of a metal or a metal nitride or a metal sulfide. In particular embodiments, the conducting component is composed of W, Mo, Ta, or Ti metal, nitrides of those metals (i.e., WN, MoN, TaN, TiN) or metal sulfides (CdS, ZnS, $Cu_2S$, $In_2S_3$) The insulating component is composed of a insulating metal oxides, for example, $Al_2O_3$ or $HfO_2$. By blending the conducting component and the resistive component, as discrete, continuous layers rather than as partial layers, the resulting resistive coating demonstrates improved temperature stability relative to conventional MCPs.

In one embodiment, a microchannel substrate having a tunable resistive coating for electron amplification comprises a resistive coating conformally coating the surfaces of the channels within the microchannel substrate. The resistive coating is characterized by a coating resistivity and a coating thickness, and may include a metal oxide, metal nitride and metal sulfide insulating component and a conductive component comprising at least one of a metal, a metal nitride and a metal sulfide. The microchannel substrate further includes an emissive coating conformally coating the resistive coating. The emissive coating is configured to produce a secondary electron emission responsive to an interaction with an electron received by one of the plurality of channels. The coating resistivity is selectively established by a ratio of the insulating component to the conductive component within the resistive coating.

In another embodiment, a method of preparing a highly resistive microchannel plate detector having tunable resistivity, comprises coating the surfaces of the plurality of channels within a microchannel substrate with a resistive coating comprising a predetermined ratio of an insulating component and a conductive component of at least one of a metal, a metal nitride or a metal sulfide. The method further includes forming an emissive coating over the resistive coating. the emissive coating is adapted to produce a secondary electron emission responsive to an interaction with an electron received by one of the plurality of channels. The resistivity of the microchannel plate detector is definable by establishing the ratio of the insulating component and the conductive component of the resistive coating.

In yet another embodiment, an improved tunable resistive coating material for a microchannel plate detector comprises a resistive coating material defined by a resistivity and a positive thermal coefficient. The resistive coating material includes a plurality of alternating, continuous discrete layers of a insulating component layer of a metal oxide and a conductive component layer, where the conductive component layer consists essentially of one of a metal, a metal nitride, metal sulfide and combinations thereof. The resistivity is selectively established between about $10^6$ and about $10^{12}$ Ohms·cm by the ratio of the conductive component layer to the insulating component layer.

These and other objects, advantages, and features of the invention, together with the organization and manner of operation therefore, will become apparent from the following detailed description when taken in conjunction with the accompanying drawings, wherein like elements have like numerals throughout the several drawings described below.

BRIEF DESCRIPTION OF THE DRAWINGS

FIGS. 8A-8C are images of various stages of an ALD MCP preparation process showing a view of the front surface of a bare MCP (FIG. 8A), the MCP after 500 ALD cycles of W:$Al_2O_3$ at a deposition temperature of 200° C. (FIG. 8B), and the MCP of FIG. 8B after coating the front and the rear surfaces with a 200 nm Cr electrode (FIG. 8C);

FIGS. 9A-9C show scanning electron microscope (SEM) images of a portion of the MCP of FIG. 8C at low magnification (FIG. 9A), high magnification (FIG. 9B), and a high magnification cross-section of a portion of the MCP across a number of MCP channels (FIG. 9C);

FIG. 15A shows a schematic of an experimental setup to evaluate MCP detectors prepared according to embodiments of the present invention, and FIG. 15B is an image of a secondary electron emission on a phosphor screen produced from a MCP detector prepared by ALD of a resistive coating layer of W:$Al_2O_3$ and ALD of a 50 Å secondary electron emissive layer of $Al_2O_3$.

DETAILED DESCRIPTION OF EMBODIMENTS

Figure 1:
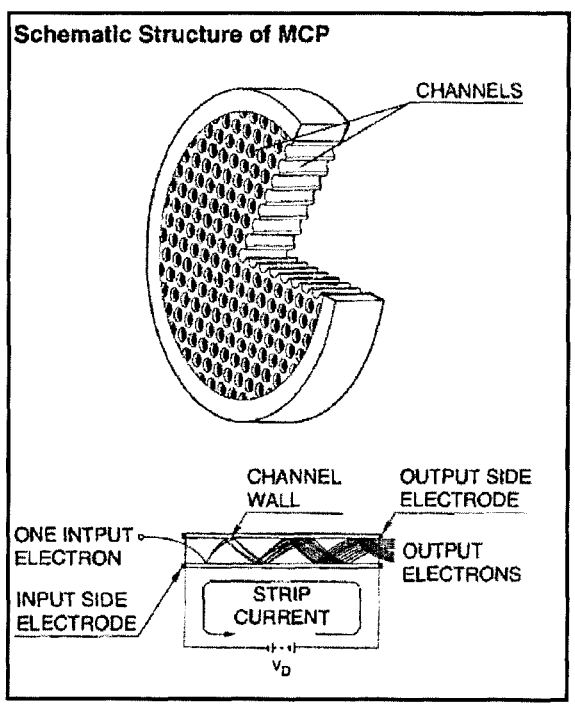
FIG. 1 is a schematic of a conventional MCP plate and configuration of a channel within the MCP.

According to various embodiments of the present invention, a tunable electrically resistive coating material is prepared. The coating material may be utilized for MCP detector fabrication by conformally depositing the coating material on the exposed surfaces of a microporous plate or substrate. The MCP coating material may include a resistive coating material and an emissive coating material. The present deposition process provides independent control over the properties of the resistive and the emissive layers, supplanting the conventional hydrogen firing process used to prepare MCPs.

The resistive tunability of the coating material is accomplished by controlling the composition of the coating material. In particular, the resistive coating material includes resistive components and conductive components. According to various embodiments, by adjusting the ratio of conductive components to resistive components, the resistivity of the resistive coating may be tuned over at least seven orders of magnitude. Additionally, by varying the thickness of the resistive coating material within the pores of the substrate, the resistivity may further be tuned as desired. Modulating these parameters (resistive component ratio and resistive coating material thickness), the electrical resistance of the coating material may be selectively controlled over a broad range of resistance with substantial precision. Moreover, by separating the formation of the resistive and emissive components, the resistivity of the MCP may be controlled independently of the emissive properties.

The resistive coating material comprises a composition of a conductive material and an insulating material that is thermally stable in an MCP detector environment. In various embodiments, the conductive material is a metal, a metal nitride, a metal sulfide, or a combination thereof. The conductive material may utilize more than one metal and/or metal nitride and/or metal sulfide. In particular embodiments, the conductive material may be one or more of: W, Mo, Ta, or Ti, or the nitrides thereof (i.e., WN, MoN, TaN, or TiN), or semiconducting metal sulfides (e.g., CdS, ZnS, $Cu_2S$, or $In_2S_3$). The conductive materials of the present embodiments demonstrate improved thermal stability for deployment in the resistive layer of the MCP detector relative to metal oxides that may be used as conductive components in conventional detectors. In particular, tunable resistance coatings prepared using the conventional metal oxides may have a negative temperature coefficient making these metal oxide materials susceptible to thermal runaway when deployed in a detector. Specifically, as the temperature of the detector increases, the resistance decreases causing more electrical current to flow, in turn further elevating the temperature. Additionally, conductivity stability of the present materials is enhanced relative to conventional metal oxides where conductivity varies significantly with environment, i.e., the gas sensor effect. Still further, the conductive materials may be deposited on the MCP at relatively low deposition temperatures of about 200° C. or lower.

The insulating material is a resistive metal oxide, and in particular embodiments, may be one or more of: $Al_2O_3$, $HfO_2$, MgO, $TiO_2$, $Y_2O_3$, or $ZrO_2$. The insulating material may also be an oxide of the Lanthanide series or of the rare earth elements. In other embodiments, the insulating material comprises one or more Perovskites, including: $CaTiO_3$, $BaTiO_3$, $SrTiO_3$, $PbTiO_3$, lead zirconate titanate (PZT), lead lanthanum zirconate titanate (PLZT), lead magnesium niobate (PMN), $KNbO_3$, $K_xNa_{1-x}NbO_3$, or $K(Ta_xNb_{1-x})O_3$.

The respective conductive material and insulating material are deposited on the microporous substrate using a chemical deposition process such as chemical vapor deposition (CVD) or atomic layer deposition (ALD). The ALD process is capable of conformally coating the MCP including the internal channel surfaces within the substrate. ALD also provides precise composition control, and thus independent control over resistive and emissive performance of the MCP, via self-limited surface reactions. In various embodiments, the resistive layer may be formed using alternative deposition techniques that are known in the art, including CVD.

Figure 2A:
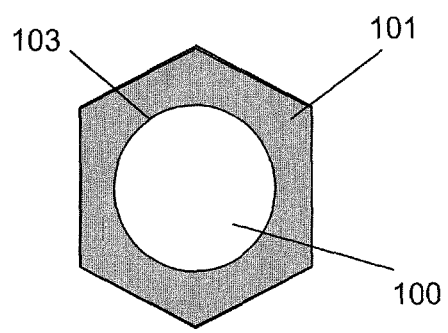
FIGS. 2A-2C are schematics of a cross-section through a single MCP channel (FIG. 2A) prepared according to an embodiment of the present invention utilizing ALD of a multi-component resistive coating material layer (FIG. 2B), and ALD of an emissive coating material layer (FIG. 2C)
Figure 2B:
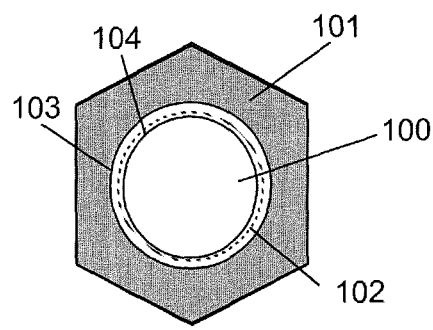

In various embodiments, ALD is utilized to first deposit onto all of the exposed surfaces of the MCP a resistive coating, which is followed by deposition of an electron emissive coating. FIG. 2A depicts a schematic of a cross-section a single MCP channel 100 within a portion of a microporous substrate 101. In an initial step, a resistive coating 102 is deposited onto the channel surface 103, FIG. 2B. An emissive coating 104 may then be deposited over the resistive coating 102, FIG. 2C. As depicted in FIG. 3, which schematically depicts a cross-section through a portion of a coated MCP, a metal electrode 105 is deposited onto the front surface 106 and the rear surface 107 of the MCP detector 101. The metal electrodes may be deposited using techniques known in the art, including metal evaporation. The metal coating may be applied in such a way as to penetrate by a controlled distance into each of the pores. This process is know as end spoiling.

As alluded to above, the resistive coating 102 is a blend of insulating and conductive components where the ratio of the components determines the resistivity of the system. Additionally, substantial control over the resistivity may be achieved by modulating the thickness of the resistive coating 102 within the channels. Using ALD, the resistive coating 102 is highly tunable, meaning the electrical resistance of the coating can be controlled by adjusting the composition of the resistive material. Additionally, the present ALD process permits separation of the resistive and emissive functions of the MCP into separate coating components that can be independently optimized in view of the application.

The ALD precursor pulse sequence may be used to achieve the desired composition of the resistive coating. The atomic layer deposition of alloys is conventionally deposited through a 1:X (X: 1, 2, 3, . . . ) cycle ratio. One cycle is usually performed for the doping component and then X cycles are performed for the main component. For example, 1:1 indicates a 50% doping ratio. A ratio of 1:2 indicates a 33.3333% doping ratio, and so on. However, in various embodiments of the present invention, doping can also be performed as Y:X, where Y could be 2, 3, 4, or any number of cycles. For example, a 50% doping ratio could be performed as 1:1, 2:2, 3:3, 4:4, . . . , etc. Likewise, 33.33% could also be performed as 1:2, 2:4, 3:6 and so on. The benefit of this scenario is that dispersed conductive nanoparticles with tunable size can be formed inside the insulating materials with tunable thickness, while at the same time maintaining the tenability of the resistivity of the material. This procedure may improve the thermal stability of the electrical properties of the MCPs by allowing a positive thermal coefficient coating as a result of the thicker insulating layers between the conductive phases using the thermal expansion phenomenon described above.

ALD of the resistive layer 102 may be accomplished by forming alternating discrete, continuous layers of the insulating component and discrete, continuous layers of the conductive component. Accordingly, the resistive layer 102 comprises a nanolaminate of a plurality of alternating continuous thin layers of the conductive component (the conductive component layer) and the insulating component (the insulating component layer). By forming discrete metallic domains that are continuous component layers rather than partial component layers, the resulting resistive layer 102 exhibits a positive temperature coefficient and improved thermal stability over that of a conventionally formed MCP. That is, increasing the temperature of the MCP will promote separation of the conductive and resistive domains as a result of the positive thermal expansion coefficient, an thereby decrease the electrical conductivity.

The desired resistivity of the resistive layer 102 may be achieved by selection of the insulating component and the conductive component and, in particular, the ratio of the components deposited on the MCP. The resistive component ratio, the ratio of the conductive component to the insulating component) is controlled by modulating the ratio of ALD cycles of the respective components. Thus, a 1:2 ratio of ALD cycles of the conductive component (1 cycle) and the insulating component (2 cycles), approximates a 1:2 resistive component ratio of the conductive component to the insulating component in the resistive layer 102. By increasing the portion of the conductive component of the ratio, the resistivity may be adjusted, in various embodiments, by at least seven orders of magnitude, for example, from about $10^6$ to about $10^{14}$ Ohms·cm.

A typical ALD scheme may be utilized for forming the insulating component layers and the conductive component layers that make up the resistive layer. Namely, in an ALD reactor a insulating component layer is formed by alternately exposing a substrate, such as MCP, to a metalorganic precursor or other metallic precursor compound and an oxidizing reactant, thus forming the insulating metal oxide component layer on the surfaces of the MCP, including the channel surfaces within the MCP. Similarly, the conductive component layer is formed by alternately exposing the substrate to a metalorganic precursor or other metallic precursor compound and an additional reactant such as an oxygen-free precursor which may be a reducing agent, thus forming the conductive metal or metal nitride or metal sulfide layer on the MCP. This typical ALD operating cycle can be described as A/B/C/D, where A represents the metalorganic compound or other metal compound associated with the conductive component layer, B represents the additional reactant for A, C represents the metalorganic or other metal compound associated with the resistive component layer, and D represents the reducing, nitriding, or sulfiding reactant for C. Under the typical ALD cycle, a purge period of inert gas follows each exposure of predetermined duration of the reactants A, B, C, and D.

Figure 4:
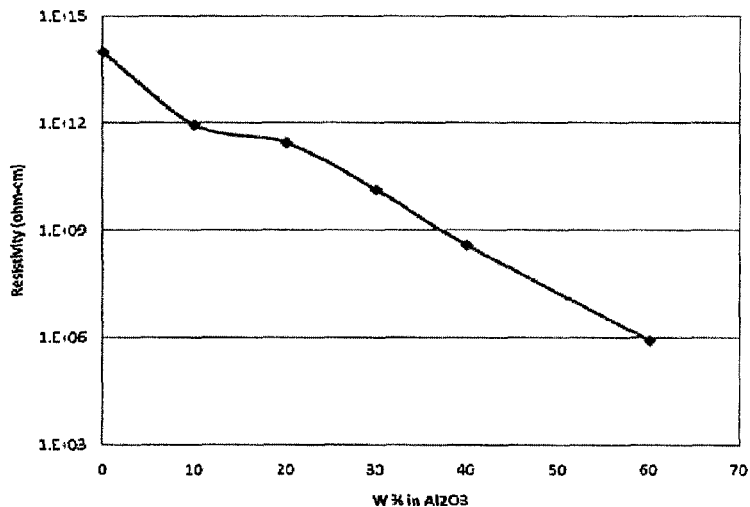
FIG. 4 is a plot of resistivity (Ohm-cm) for a resistive coating material layer of tungsten (W) and aluminum oxide ($Al_2O_3$) on an MCP substrate for a varying amount of W between 0 and 60 percent.

The resistive layer component ratio is established by modulating the ALD cycles of [A/B] to [C/D]. For example, a 1:2 resistive component ratio is approximated by performing one ALD cycle of [A/B] for two ALD cycles of [C/D], A/B/C/D/C/D. One skilled in the art will appreciate that various resistive component ratios may be applied to obtain the desired thickness of the component layers and resistivity of the resistive layer 102. FIG. 4, for example, plots the resistivity (Ohm-cm) of an ALD of tungsten (W) and aluminum oxide ($Al_2O_3$) resistive layer 102 on a MCP substrate for a varying relative amount of W ALD cycles between 0 and 60 percent. The resistivity decreases sharply with increasing conductive component (W) in the resistive component ratio. The MCP resistivity is tunable over several orders of magnitude in the exemplary configuration, ranging from about $10^6$ to about $10^{13}$ Ohm-cm for resistive layer compositions having between about 10 and 60 percent W, where the ALD sequence is defined by $(100-x)\%(TMA-H_2O)$-x $\%(Si_2H_6-WF_6)$. Precise control over the resistivity may accordingly be achieved by the managing the ratio (i.e., percentage) of the conductive component layer ALD cycles to insulating component layer ALD cycles.

Figure 5:
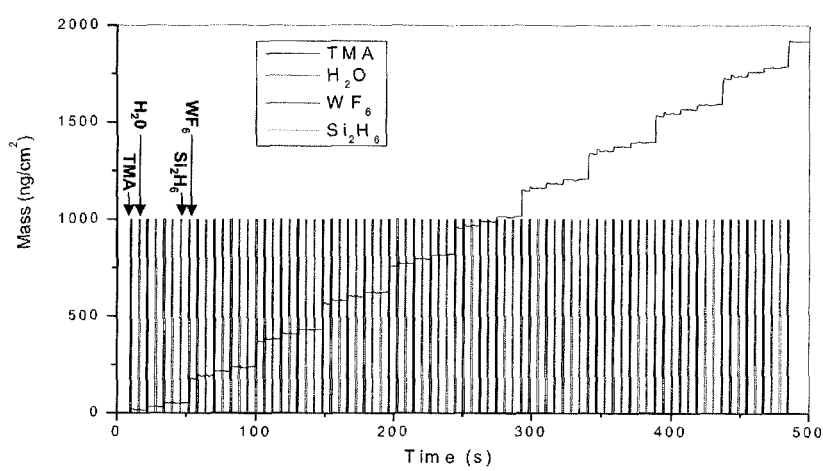
FIG. 5 is a plot of mass gain and the ALD cycle sequence for a resistive coating material layer prepared by an ALD sequence utilizing a 1:3 resistive component ratio of three ALD cycles of TMA/water and one ALD cycle of $Si_2H_6/WF_6$ at a deposition temperature of 200° C. with 1.0 second reactant exposures and 5.0 second $N_2$ purges.

ALD of the conductive component of the resistive layer may be accomplished with various precursors and additional reactants. For example, ALD of the W component layer may be prepared with alternating exposures of disilane ($Si_2H_6$) and tungsten hexafluoride ($WF_6$) with $N_2$ purges following each exposure. Likewise, ALD of the insulating component layer may utilize various precursors configured to form metal oxides of low conductivity. For example, a $Al_2O_3$ resistive component layer may be prepared with alternating exposures (and nitrogen purge) of trimethylaluminium (TMA) (Al ($CH_3$)) and water. The timing of each of the exposures may be adjusted to obtain saturation such that a continuous layer is formed on the substrate for each ALD cycle. In various embodiments each of the exposures is conducted for about 1.0 second followed by a 5.0 second purge. FIG. 5 shows the mass gain as determined using an in-situ quartz crystal microbalance and the ALD sequence for a resistive coating material with a 1:3 resistive component ratio that utilizes three ALD cycles of TMA/water to one ALD cycle of $Si_2H_6$/$WF_6$ at a deposition temperature of 200° C. with 1.0 second exposures and 5.0 second $N_2$ purges. This ALD ratio may be continued, or modified, to achieve the desired thickness of resistive layer 102.

Figure 6:
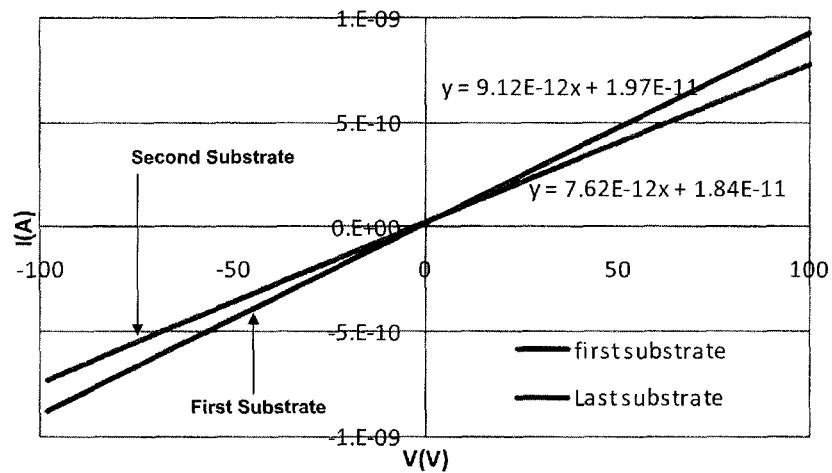
FIG. 6 is a current-voltage (I-V) plot for ALD of a Mo:$Al_2O_3$ (10% Mo) resistive coating material layer prepared at various locations (1 inch (first substrate) and 18 inch (last substrate)) within the ALD reactor.
Figure 16:
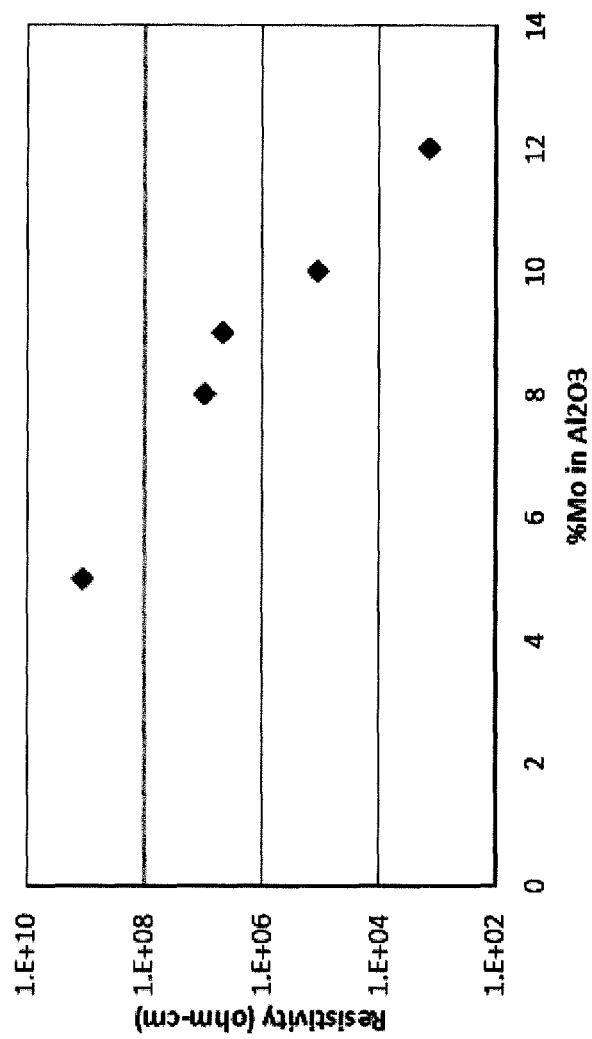
FIG. 16 shows the resistivity versus percentage of Mo cycles for a series of Mo:$Al_2O_3$ resistive coatings.

Various other metals and combinations of metals may be utilized in the conductive component of the resistive layer 102. For example, the conductive component may also comprise Mo, Ta, Ti, and combinations thereof. Further, in addition to W, various conductive component layers may utilize different metal and/or combinations of metals. Various precursors for ALD of Mo, Ta and Ti may be utilized, including molybdenum hexafluoride ($MoF_6$), tantalum pentafluoride ($TaF_5$), and titanium tetrachloride ($TiCl_4$). The Mo and Ta metal precursors may be paired with one or more various additional reactants, including disilane, silane ($SiH_4$), or diborane ($B_2H_6$), to complete the ALD sequence for the conductive component. The Ti metal precursor may be paired with hydrogen plasma. A resistive layer 102 with a conductive component comprising Mo, Ta, or Ti is formed as described above with regard to W. Specifically, a predetermined number of ALD cycles of the conductive layer component and a metal oxide insulating layer component are performed using an resistive component ratio to achieve a desired MCP resistivity. FIG. 6, for example, shows a current-voltage (I-V) plot for ALD resistive layers of Mo:$Al_2O_3$ (10% Mo) that were prepared at different locations (1 inch (first substrate) and 18 inch (last substrate) locations) within the ALD reactor and exhibiting a resistance of 110 and 130 Ohms, respectively. FIG. 16, for example, plots the resistivity (Ohm-cm) of an ALD of molybdenum (Mo) and aluminum oxide ($Al_2O_3$) resistive layer 102 on a glass substrate for a varying relative amount of Mo ALD cycles between 5 and 12 percent. The resistivity decreases sharply with increasing conductive component (Mo) in the resistive component ratio. The MCP resistivity is tunable over several orders of magnitude in the exemplary configuration, ranging from about $10^3$ to about $10^9$ Ohm-cm for resistive layer compositions having between about 5 and 12 percent Mo, where the ALD sequence is defined by $(100-x)\%(TMA-H_2O)$-x $\%(Si_2H_6-MoF_6)$.

Figure 7:
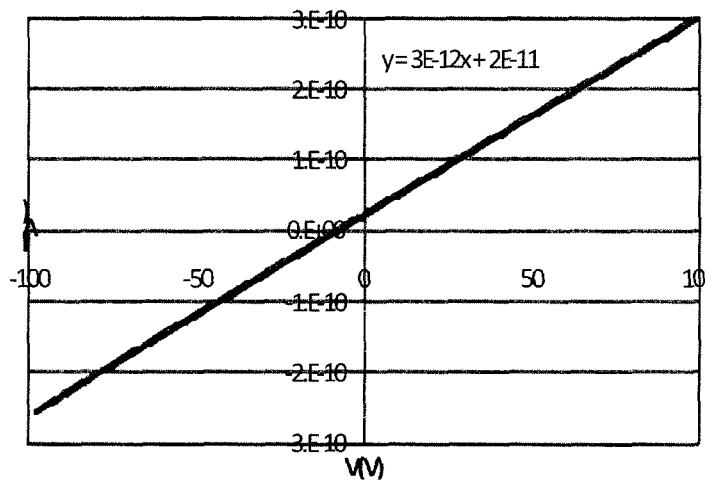
FIG. 7 is a current-voltage (I-V) plot for ALD of a WN:$Al_2O_3$ (30% WN) resistive coating material layer with a resistivity of 12.6 MΩ·cm.

The conductive component of the resistive layer 102 may also be formed using various metal nitrides, including tungsten nitride (WN), molybdenum nitride (MoN), tantalum nitride (TaN), and titanium nitride (TiN). ALD of the nitrides may be accomplished using, for example, the $WF_6$, $MoF_6$, $TaF_5$, and $TiCl_4$ metal precursors previously described. The metal precursors may be paired with various additional reactants, including ammonia, hydrazine, or alkyl hydrazines, to complete the ALD cycle and form the metal nitride on the MCP surface. For example, FIG. 7 shows an I-V plot for an ALD resistive layer comprising WN:$Al_2O_3$ (30% WN) with a resistivity of 12.6 MΩ·cm.

With reference to FIGS. 8A-8C various stages of the MCP preparation process are shown. FIG. 8A shows a view of the front surface of a bare MCP (capillary glass array) and FIG. 8B shows the front surface of the MCP after 500 ALD cycles of W:Al$_2$O$_3$ at a deposition temperature of 200° C. FIG. 8C shows the MCP of FIG. 8B after coating the front and the rear surfaces with a 200 nm Cr electrode. FIGS. 9A-9C show scanning electron microscope images of the MCP of FIG. 8C at low magnification (FIG. 9A) and high magnification (FIG. 9B). FIG. 9C shows a cross-section of the MCP across a number of MCP channels.

In various embodiments, the order of the ALD reactants may be altered without significantly effecting the deposition process or the resistivity of the resistive layer 102. For instance, for a W:Al$_2$O$_3$ resistive layer utilizing an A component of Al(CH)$_3$, a B component of H$_2$O, a C component of WF$_6$, and a D component of Si$_2$H$_6$ ALD sequences of A/B/C/D, B/A/C/D, B/A/D/C, and A/B/D/C yield similar layer growth rates and resistivity performance.

Figure 10:
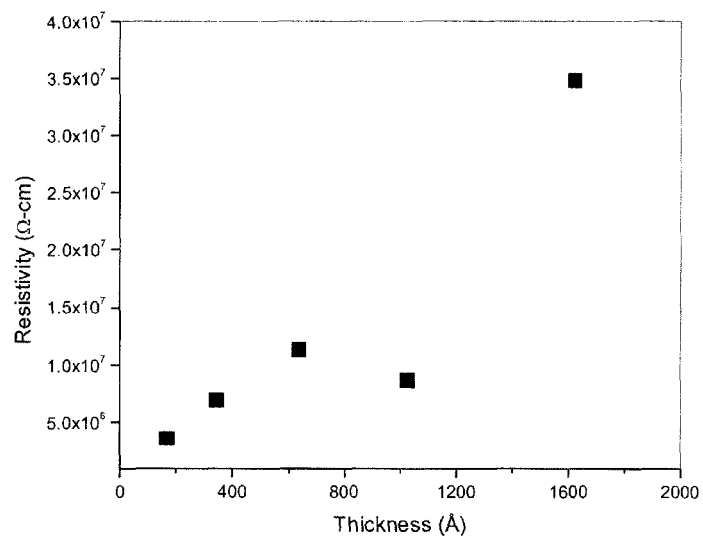
FIG. 10 is a plot of resistivity (Ohm-cm) for various thicknesses of ALD of a W:$Al_2O_3$ (27:73) resistive coating material layer of about 200 to about 1700 Angstroms.
Figure 11:
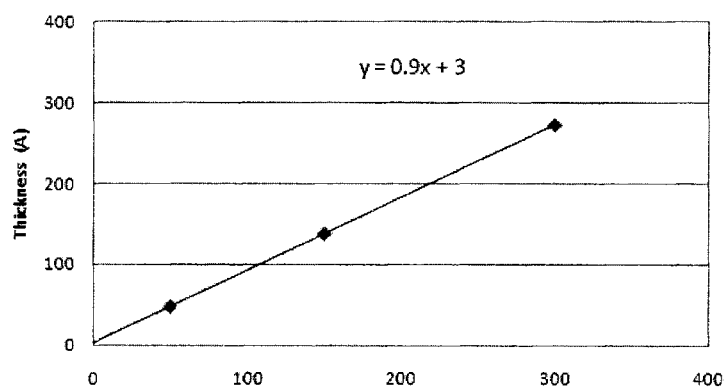
FIG. 11 is a plot of thickness of an ALD resistive coating material layer of a W:$Al_2O_3$ resistive coating layer of 30% W versus the number of ALD cycles from 50 to 300 cycles.
Figure 12:
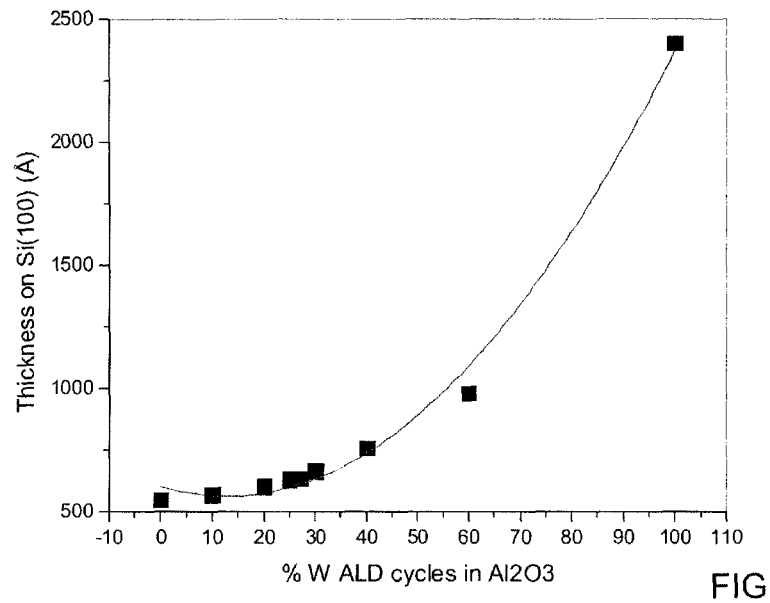
FIG. 12 is a plot of thickness of the resistive coating material layer at varying percentages of W ALD cycles in a 500 cycle ALD of W:$Al_2O_3$ on a silicon substrate at a deposition temperature of 200° C.

The resistivity of the resistive layer 102 is further related to the thickness of the resistive layer 102. In particular, the resistance is generally inversely proportional to the thickness of the resistive layer 102. Thus, resistance is also tunable by controlling the layer thickness of the resistivity layer. FIG. 10 shows resistivity for various thicknesses of a W:Al$_2$O$_3$ (27% W) resistive layer between about 300 and 1700 Angstroms. Thickness of the resistive layer 102 is also controlled by the ALD scheme. FIG. 11 shows a plot of resistive layer thickness for a W/Al$_2$O$_3$ resistive layer with 30% W. In various embodiments, the thickness of the resistive layer increases linearly with the number of ALD cycles at a growth rate from about 0.6 to about 1.6 Angstroms/cycle. Thickness and growth rate of the resistive layer 102 is also a function of the resistive component ratio. In various embodiments, increasing the conductive component in the resistive component ratio yields increased layer growth rate. FIG. 12, for example, depicts the thickness of the resistive layer 102 with varying percentage of W ALD cycles in a 500 cycle ALD of W:Al$_2$O$_3$ on a silicon substrate at a deposition temperature of 200° C.

The ALD process may be carried out at various deposition temperatures. For example, a W:Al$_2$O$_3$ resistive coating may be carried out at a deposition temperature between about 100 and 300° C. The deposition temperature may affect the resistivity of the films for instance if the growth rates of the insulating and conducting components change with temperature. In this case, the composition of the film will change even if the percentage of metal cycles is kept constant. The resistive layer 102 may be prepared using a relatively low temperature ALD, i.e., less than about 200° C. Lower deposition temperatures, e.g., between about 100° C. and about 200° C., offer flexibility in the types of substrates and substrate materials that may be used in preparing various MCP detectors.

Figure 13A:
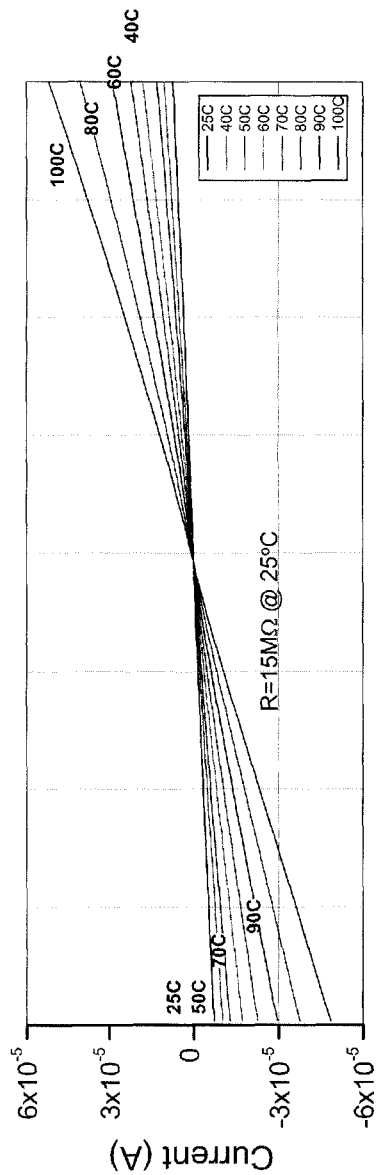
FIGS. 13A and 13B are I-V plots of W:$Al_2O_3$ between 25° C. and 100° C. for a low resistance (15 MΩ, at 25° C.) material (FIG. 13A) and a high resistance material (775 MΩ) prepared by 500 ALD cycles of TMA/$H_2O$/$Si_2H_6$/$WF_6$ with 1.0 second precursor and reactant exposures and 5.0 second nitrogen purges between precursors and reactants at a deposition temperature of 200° C.
Figure 13B:
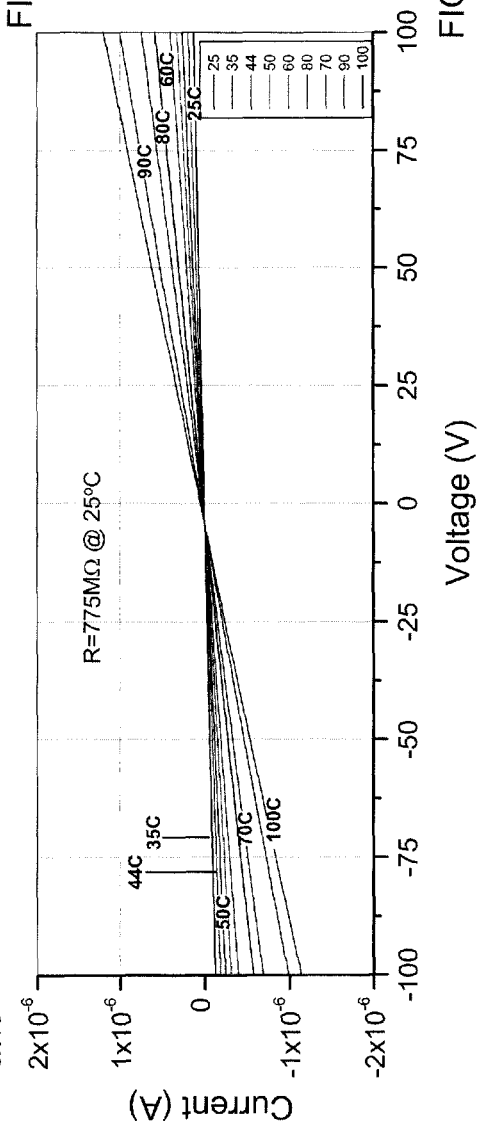

MCPs prepared by ALD with a resistive layer of a metal and/or a metal nitride conductive component layer and a metal oxide insulating layer show linear current-voltage performance across a range of temperatures. For example, FIGS. 13A and 13B show I-V plots between 25° C. and 100° C. for a low resistance (15 MΩ, at 25° C.) material (FIG. 13A) and a high resistance material (775 MΩ, at 25° C.) (FIG. 13B). The W:Al$_2$O$_3$ resistive layer was prepared using an ALD of TMA/H$_2$O/Si$_2$H$_6$/WF$_6$ with 1.0 second precursor and reactant exposures and 5.0 second nitrogen purges between precursors and reactants for 500 ALD cycles at a deposition temperature of 200° C.

Figure 14:
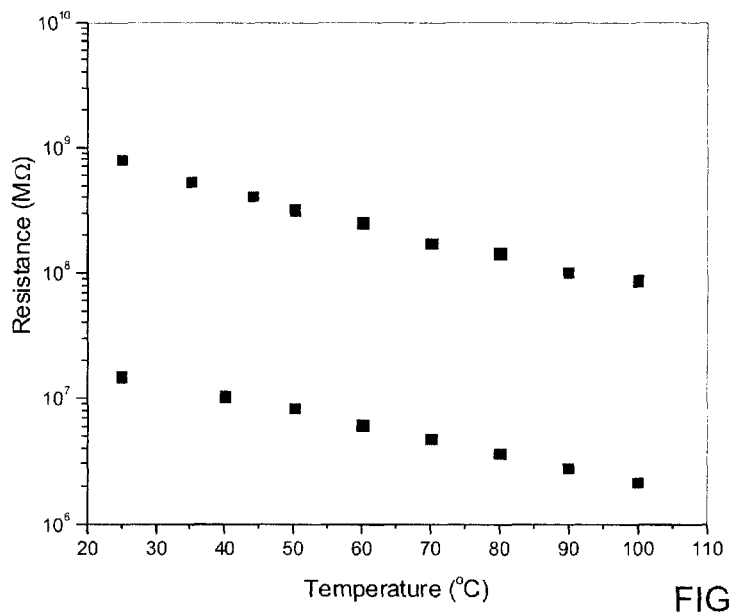
FIG. 14 is a plot of the calculated resistance of the 15 MΩ and the 775 MΩ W:$Al_2O_3$ resistive coating materials of FIGS. 13A and 13B.

FIG. 14 shows the calculated resistance of the 15 MΩ and the 775 MΩ W:Al$_2$O$_3$ resistive coating materials. The materials demonstrate a positive temperature response, i.e., decreasing resistance with increasing temperature. The temperature coefficient for the ALD resistive layer is given by $R_{MPC}=R_o \exp(-B_t(T_{MPC}-T_o))$. For similarly prepared W:Al$_2$O$_3$ resistive layers with resistances of 17 MΩ and the 800 MΩ, the temperature coefficient was determined to be 0.025 and 0.029, respectively. Accordingly, in various embodiments, the thin films prepared according to the present processes show enhanced thermal performance relative to conventional MCP, which had a temperature coefficient of about 0.05.

Figure 2C:
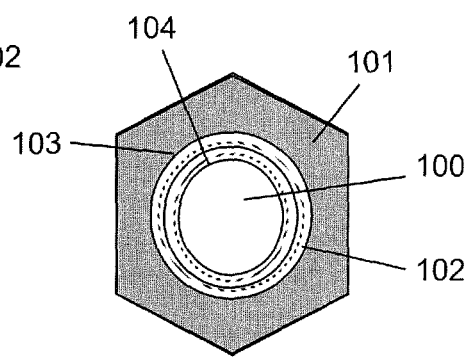
Figure 3:
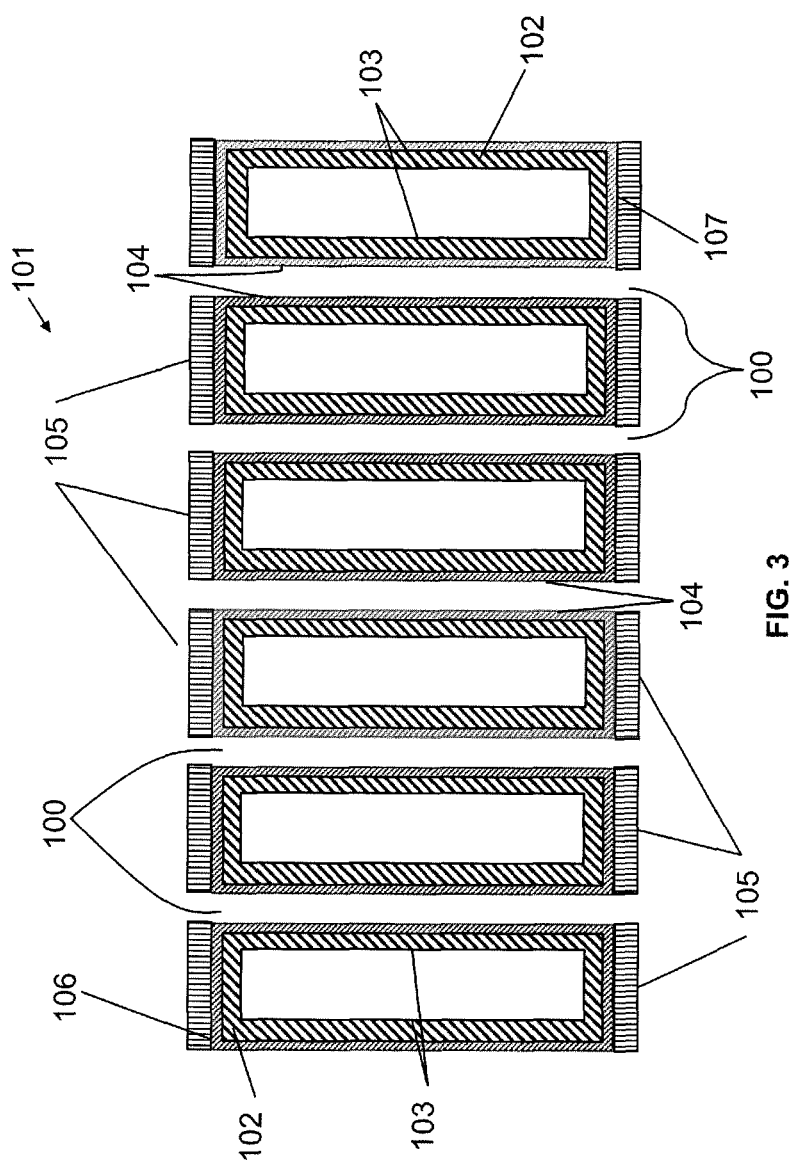
FIG. 3 is a cross-section across a plurality of MCP channels prepared according to an embodiment of the present invention by ALD.

As depicted in FIGS. 2C and 3, after deposition of the resistive coating layer 102, an emissive coating layer 104 may be deposited over the resistive layer 102 on the MCP. The emissive coating layer 104 may comprise various components, including various metal oxides, nitrides and sulfides, to obtain an amplified secondary electron emission in response to a low-level input. The secondary electron emission is detected downstream from the MCP. Like the resistive coating layer 102, the emissive coating layer 104 may be formed by ALD or CVD. In one embodiment, the emissive coating comprises Al$_2$O$_3$ via ALD using TMA/water. In various embodiments, multiple emissive coating layers 104 may be deposited within the MCP channel. The structure of MCP detector is substantially completed by metalizing the front and rear surfaces of the MCP to form the electrodes. In some embodiments, the metalizing electrode layer can be deposited on the front and rear surfaces of the MCP before the resistive and emissive coating layers are applied.

In various embodiments, the MCP may further comprise a neutron-absorbing material layer, which permits the MCP detector to indirectly measure incident neutrons. Neutron absorption by the neutron-absorbing layer leads to an electron emission within the MCP channels which is subsequently amplified by the cascade of secondary emission events and then is detected downstream from the MCP. A neutron-absorbing layer may be incorporated within the resistive coating layer 102 or within the emissive coating layer 104 or comprise a distinct layer in addition to the resistive coating layer 102 and the emissive coating layer 104. As a distinct layer, the neutron-absorbing layer may be located under the resistive coating layer 102 or between the emissive coating layer 104 and resistive coating layer 102. In various embodiments, the emissive coating layer 104 or the resistive coating layer 102 may be the neutron-absorbing layer.

Various neutron-absorbing materials may be utilized in the neutron-absorbing layer, including oxides and nitrides of boron (B) and gadolinium (Gd), which have high (i.e., 3,840 and 259,000 barns, respectively) neutron absorption cross-sections. The neutron-absorbing material incorporated in the coating within the MCP channels emits high-energy particles in response to a neutron-adsorbing event, which occurs when a neutron enters a MCP channel. The high-energy particles in turn generate electrons, which are amplified by the cascade of secondary emission events within the MCP.

ALD of the neutron-absorbing material may be accomplished using various neutron-adsorbing precursors, such as B and Gd precursors, and an additional neutron-absorbing layer precursor reactant to form B and/or Gd oxides and/or nitrides. For example, suitable Gd ALD precursors for ALD of gadolinium oxide Gd$_2$O$_3$ include: Gd[N(SiMe$_3$)$_2$]$_3$, Gd(thd)$_3$, Gd(MeCp)$_3$, Gd(Cp)$_3$, or Gd(Me$_5$Cp) and may be paired with water, ozone, hydrogen peroxide, nitrous oxide, or oxygen plasma. Suitable B ALD precursors for ALD of boron oxide (B$_2$O$_3$) or boron nitride (BN) include: diborane (B$_2$H$_6$), decaborane (B$_{10}$H$_{14}$), boron trifluoride (BF$_3$), boron trichloride (BCl$_3$), or boron tribromide (BBr$_3$). The B ALD precursors may be paired with water, ozone, hydrogen peroxide, nitrous oxide, or oxygen plasma to prepare $B_2O_3$. The B ALD precursors may paired with ammonia, hydrazine, alkyl-hydrazine, $NH_3/H_2$ plasma, or $N_2/H_2$ plasma to prepare BN.

With reference to FIGS. 15A and 15B, evaluation of an ALD metal/metal oxide MCP is demonstrated. FIG. 15A depicts a 1 mm thick MCP detector 200 with a 96 nm ALD resistive coating layer of $Mo:Al_2O_3$ (10% Mo cycles) and a 5 nm ALD secondary electron emissive layer of $Al_2O_3$. A high voltage (1,200 V) was applied to the MCP electrodes located on the front and rear surfaces of the MCP. The MCP detector was evacuated to about $10^{-6}$ Torr. The front surface of the MCP was uniformly illuminated with ultraviolet light from a lamp in order to produce photoelectrons that would enter the pores at the inlet side of the MCP and be amplified. A phosphor screen 201 was placed behind the MPC detector, i.e., opposite the source of incident electrons 202. A camera 203 was placed behind the phosphor screen 201 to view the phosphor screen 201 in response to the output of secondary electrons 204 exiting from the MCP 200. The resulting image obtained by the camera 203 of the output from the MCP detector 200 is depicted in FIG. 15B. The ALD formed MCP yielded uniform electron amplification.

Figure 17A:
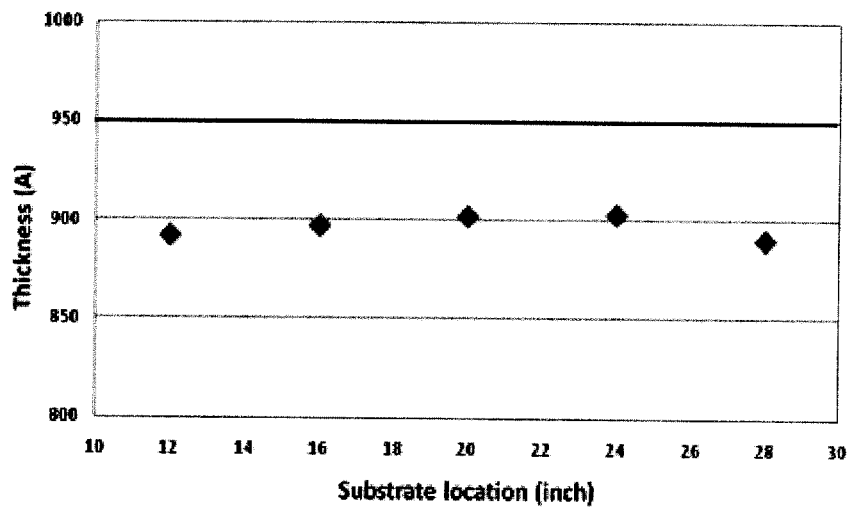
FIG. 17A shows the thickness versus position in the ALD reactor for a series of Mo:$Al_2O_3$ resistive coatings prepared using 500 cycles of ALD Mo:$Al_2O_3$ (11% Mo)
Figure 17B:
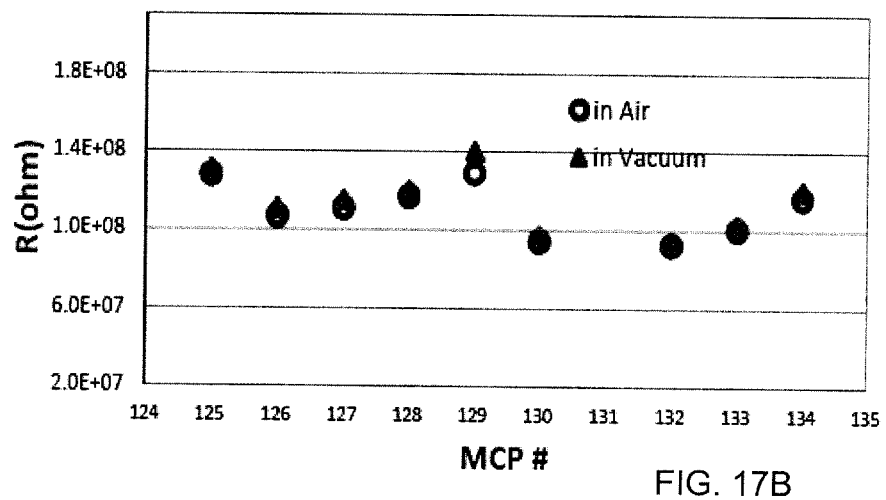
FIG. 17B shows the resistance for a series of MCPs prepared using resistive coatings comprised of 80 nm Mo:$Al_2O_3$ (11% Mo) and emissive coatings comprised of 5 nm $Al_2O_3$, where the triangles show resistance measurements performed in vacuum and the circles show resistance measurements performed in air.

A series of five MCP substrates and five silicon substrates were arranged longitudinally along the flow axis of the ALD coating system and subjected to 50 cycles of $TMA/H_2O$ using the timing sequence to passivate the surface followed by 500 ALD cycles of $Mo:Al_2O_3$ (11% Mo cycles) using the timing sequence (to form the resistive coating and finally 50 cycles of $TMA/H_2O$ to form the emissive coating. The ALD was all performed at 200° C. using the timing sequence 2-10-2-10 for both the $Al_2O_3$ and the Mo. The thicknesses of the coatings were measured from the silicon witness coupons located adjacent to the MCP substrates are shown in FIG. 17*a* and are all 90 nm within a uniformity of 1%. Next, the MCPs were coated with 200 nm nichrome to serve as electrodes. The resistances of the 5 MCPs were measured in air and under a vacuum of approximately $10^{-6}$ Ton and are shown in FIG. 17B as MCP Nos. 125-129. The resistances were nearly the same under vacuum and in air demonstrating good environmental stability (i.e. no "sensor effect"). Moreover, the resistances were all in the range of 120 Mohm with 10% variation. A second batch of 4 MCPs (Nos. 130-134) processed using the same procedure on a different day also yielded very similar resistance values.

Figure 18A:
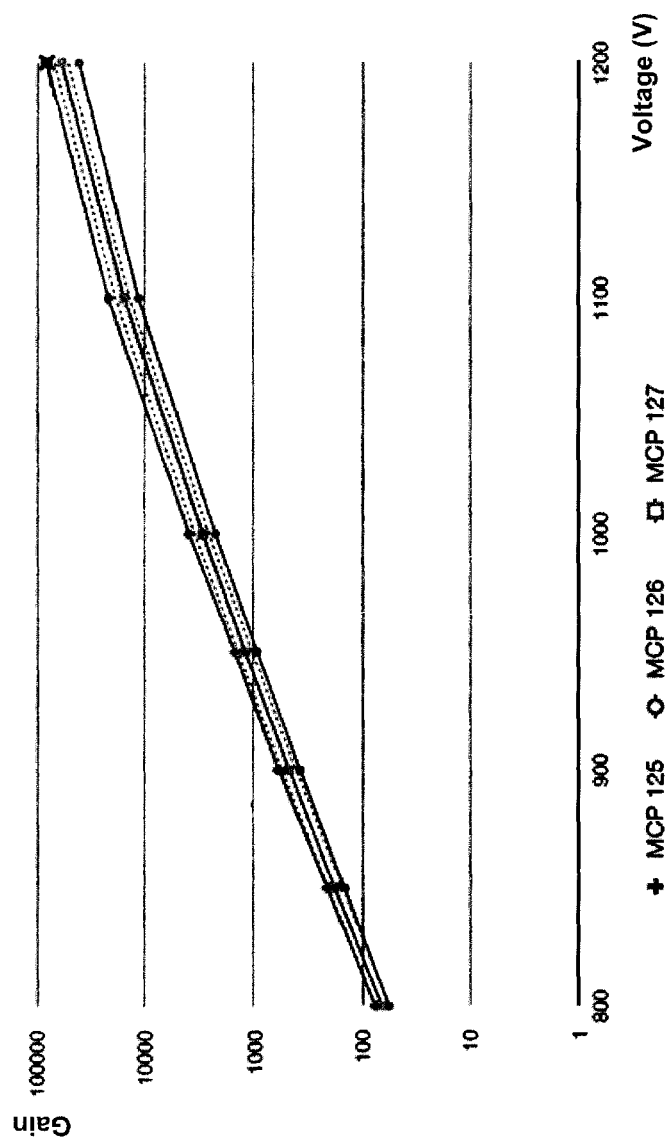
FIG. 18A shows the gain versus bias voltage for MCPs 125, 126 and 127 shown in FIG. 17A showing an average gain of $6 \times 10^4$ at a bias voltage of 1200V.

MCPs NOs. 125, 126, and 127 were loaded individually into a vacuum testing chamber. The gain of each MCP was determined by applying a bias potential of 800-1200 volts and subjecting the MCP to a fixed input current of electrons generated by a second MCP in front of the test MCP. The output current of the MCP being tested was measured and the ratio of this current to the input current was the gain as shown in FIG. 18A. The gain increased from $\sim 10^2$ at 800 volt bias to $\sim 10^4$-$10^5$ at 1200 volt bias. The gains for the three MCPs were all very similar.

The foregoing description of embodiments of the present invention have been presented for purposes of illustration and description. It is not intended to be exhaustive or to limit the present invention to the precise form disclosed, and modification and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A microchannel substrate with a tunable resistive thin layer coating for electron amplification comprising:
   a microchannel substrate having a front surface and a rear surface, the microchannel substrate including a plurality of channels extending substantially parallel through the substrate between the front surface and the rear surface;
   a multi-component resistive coating conformally coating the surfaces of the plurality of channels within the microchannel substrate, the multi-component resistive coating characterized by a coating resistivity and a coating thickness, comprising
   a metal oxide insulating component;
   a conductive component comprising dispersed nanoparticles selected from the group consisting of: Mo, Ta, Ti, W, and the nitrides thereof; and
   an emissive coating conformally coating the multi-component resistive coating, the emissive coating configured to produce a secondary electron emission responsive to an interaction with a particle received by one of the plurality of channels,
   wherein the coating resistivity is selectively established by a resistive component ratio of the conductive component to the insulating component within the multi-component resistive coating.

2. The microchannel substrate of claim 1, wherein the multi-component resistive coating consists essentially of $Al_2O_3$ and one of W, Mo, tungsten nitride, and molybdenum nitride.

3. The microchannel substrate of claim 1, wherein the multi-component resistive coating consists essentially of $Al_2O_3$ and one of W and Mo.

4. A method of preparing a highly resistive microchannel plate detector having tunable resistivity, comprising:
   providing a microchannel plate substrate, the microchannel plate substrate having a front surface and a rear surface and a plurality of channels extending through the substrate between the front surface and the rear surface;
   coating the surfaces of the plurality of channels within the microchannel substrate with a resistive coating comprising an insulating component containing conductive component dispersed in the insulating component, the conductive component selected from the group consisting of: Mo, Ta, Ti, W and the nitrides thereof;
   forming the insulating component by performing a first predetermined number of atomic layer deposition (ALD) cycles of alternating exposures of the microchannel plate substrate to a first metal precursor and an oxidizing reactant to form an insulating component layer composed of a metal oxide layer;
   forming the conductive component by performing a second predetermined number of ALD cycles of alternating exposures of the microchannel plate substrate to a second metal precursor and an additional reactant to form a conductive component comprising a plurality of dispersed nanoparticles formed in the insulating layer; and
   forming an emissive coating over the resistive coating, the emissive coating adapted to produce a secondary electron emission responsive to an interaction with a particle received by one of the plurality of channels,
   wherein the resistivity of the microchannel plate detector is substantially defined by the ratio of the second predetermined number of ALD cycles to the first predetermined number of ALD cycles.

5. The method of claim 4, wherein the resistive coating is characterized by a positive thermal coefficient, wherein the resistivity of the resistive coating increases with increasing temperature of the microchannel plate substrate.

6. The method of claim 4, wherein the second metal precursor is selected from the group consisting of: $MoF_6$, $TaF_5$, $TiCl_4$, and $WF_6$.

7. The method of claim 4, wherein the additional reactant is selected from one of a first group to form a metal conductive component layer, a second group to form a metal nitride conductive component layer, and a third group to form a metal sulfide component layer, wherein the first group consists of: disilane, silane, and diborane, the second group consists of: ammonia, hydrazine, and alkyl hydrazines, and the third group consists of hydrogen sulfide and thioacetamide.

8. An improved multi-component tunable resistive coating material for a microchannel plate detector, comprising: a resistive coating material defined by a resistivity and a positive thermal coefficient, the resistive coating material comprising a plurality of alternating, continuous discrete layers of an insulating component layer of a metal oxide having a conductive component formed therein comprising a plurality of dispersed nanoparticles, the conductive component selected from the group consisting of Mo, Ta, Ti, W, and the nitrides thereof, the resistivity selectively established between about $10^6$ and about $10^{12}$ Ohms·cm by the ratio of the conductive component to the insulating component layer.

\* \* \* \* \*